US008884577B2

(12) United States Patent
Tsuji

(10) Patent No.: US 8,884,577 B2
(45) Date of Patent: Nov. 11, 2014

(54) CONTROL APPARATUS FOR ROTARY ELECTRIC MACHINES

(75) Inventor: Hiroya Tsuji, Yokkaichi (JP)

(73) Assignee: Denso Corporation, Kariya (JP)

( * ) Notice: Subject to any disclaimer, the term of this patent is extended or adjusted under 35 U.S.C. 154(b) by 403 days.

(21) Appl. No.: 13/234,487

(22) Filed: Sep. 16, 2011

(65) Prior Publication Data

US 2012/0068645 A1    Mar. 22, 2012

(30) Foreign Application Priority Data

Sep. 17, 2010  (JP) .................................. 2010-208768
Jul. 28, 2011  (JP) .................................. 2011-164964

(51) Int. Cl.
*H02P 27/04*    (2006.01)
*H02M 1/32*     (2007.01)
*H02P 27/08*    (2006.01)
*G01R 31/34*    (2006.01)
*G01R 31/42*    (2006.01)

(52) U.S. Cl.
CPC ................. *H02M 1/32* (2013.01); *H02P 27/08* (2013.01); *G01R 31/343* (2013.01); *G01R 31/42* (2013.01)
USPC .................. 318/801; 318/400.21; 318/400.22; 318/400.26; 318/400.27; 318/400.28; 363/40; 363/55; 363/56.1; 363/95; 701/39; 701/43; 701/62; 700/143

(58) Field of Classification Search
CPC .... B60L 3/003; B62D 5/0487; G01R 31/025; G01R 31/34; H02M 1/32; H02M 7/53871; H02M 1/38; H02P 2207/05; H02P 27/06; H02P 29/021; H02P 29/022; H02P 27/08; G05B 19/406; H02H 7/10
USPC ............. 318/400.01, 400.21, 400.26, 400.27, 318/400.28, 599, 800, 801, 432, 400.22, 318/528; 363/40, 55, 56.04, 56.07, 56.1, 363/95; 361/23, 30, 31, 50; 701/39, 43, 62; 700/143
See application file for complete search history.

(56) References Cited

U.S. PATENT DOCUMENTS 7,759,888 B2 * 7/2010 Matsui et al. ............ 318/400.29
8,054,026 B2 * 11/2011 Shimana et al. .............. 318/490

(Continued)

FOREIGN PATENT DOCUMENTS

CN      101485080      7/2009
JP      2008-011683    1/2008

(Continued)

OTHER PUBLICATIONS

Office Action (14 pgs.) dated Nov. 19, 2013 issued in corresponding Chinese Application No. 201110288572.0 with an at least partial English-language translation thereof (9 pgs.).

*Primary Examiner* — Anthony M Paul
(74) *Attorney, Agent, or Firm* — Nixon & Vanderhye PC

(57) ABSTRACT

In a control apparatus for a rotary electric machine receiving power from a DC power supply, a DC-AC converting circuit is provided with serially connected circuits each having high-potential-side and low-potential-side switching elements. When a short-circuit occurs at the switching elements, all the switching elements are turned OFF for failsafe and a path connecting the machine and the battery is opened. In such a case, a switching element belonging to part of the switching elements is turned ON, with potential at all the terminals of the rotary electric machine being the same. A location of the short-circuit occurs is identified, based on changes in current passing through the machine and being detected in response to turning ON the switching element. The changes are at least one of a reduction change in deviation of the current from a zero point and a reduction change in an absolute value of the current.

21 Claims, 11 Drawing Sheets

(56) References Cited

U.S. PATENT DOCUMENTS

2009/0251831 A1* 10/2009 Shiba et al. .................. 361/30
2010/0036555 A1*  2/2010 Hosoda et al. ............... 701/22
2010/0263953 A1* 10/2010 Shimana ................. 180/65.285

FOREIGN PATENT DOCUMENTS

| JP | 2008-220045 | 9/2008 |
| JP | 4240149 | 3/2009 |

* cited by examiner

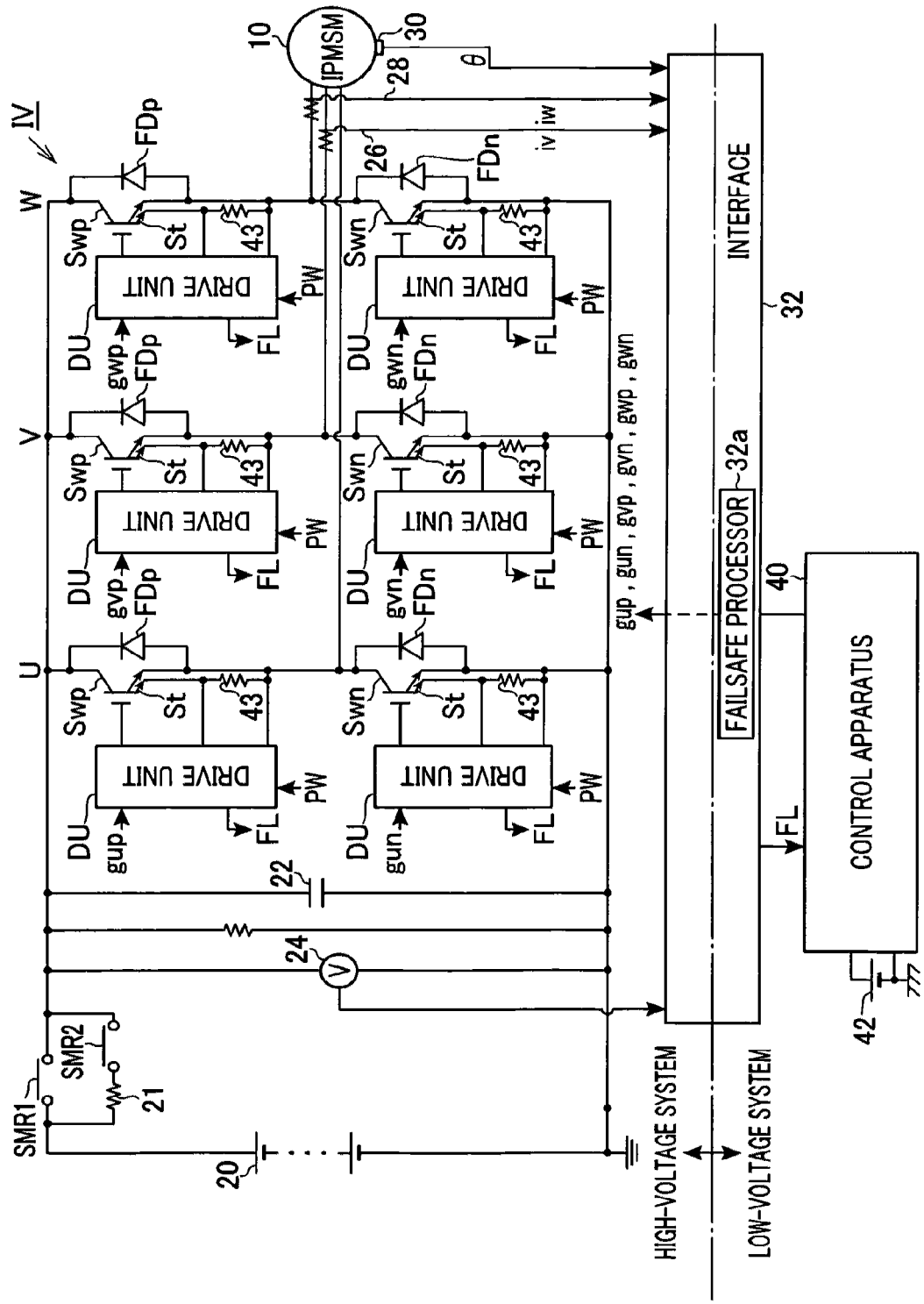

CURRENT WAVEFORMS WHEN
SHORT-CIRCUIT OCCURS IN ONE PHASE

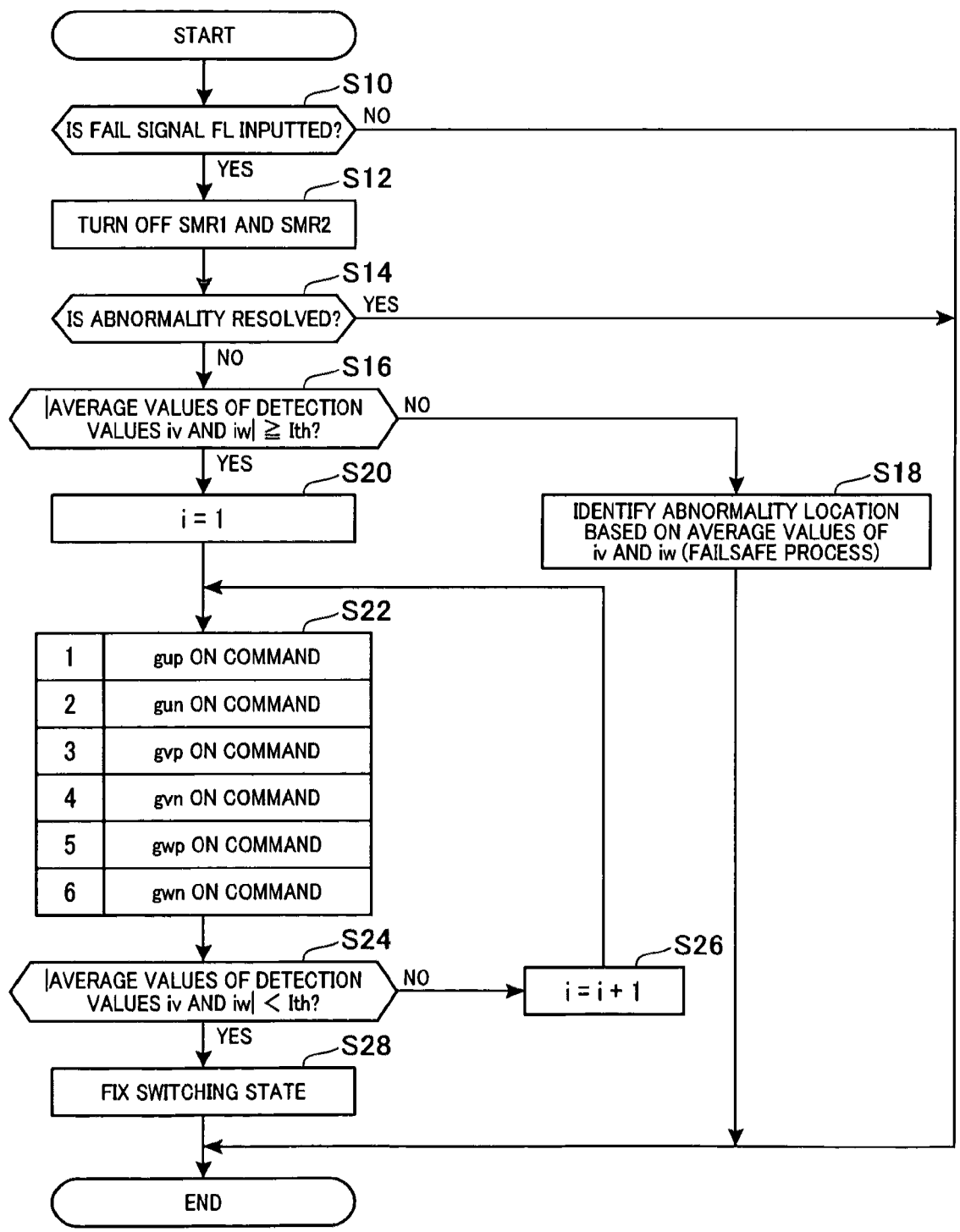

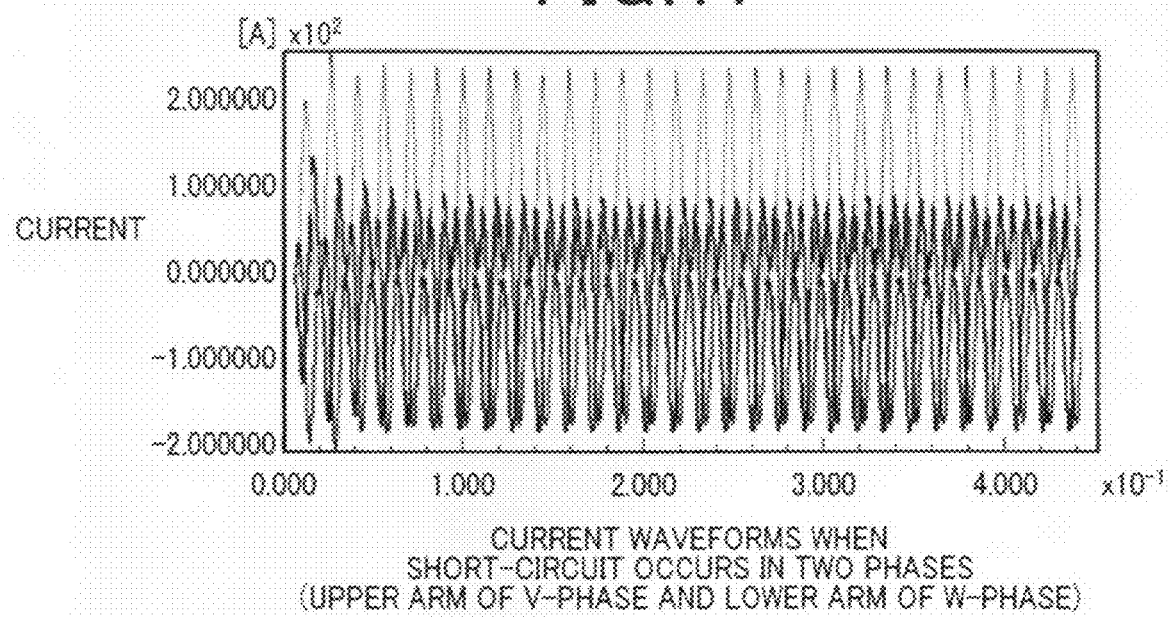

CONTROL APPARATUS FOR ROTARY ELECTRIC MACHINES

CROSS-REFERENCE TO RELATED APPLICATION

This application is based on and claims the benefit of priority from earlier Japanese Patent Application No. 2010-208768 filed Sep. 17, 2010 and No. 2011-164964 filed Jul. 28, 2011, the descriptions of which are incorporated herein by reference.

BACKGROUND OF THE INVENTION

1. Field of the Invention

The present invention relates to a control apparatus for rotary electric machines, and in particular to the control apparatus equipped with a DC-AC converter having switching elements to control power from a DC power supply to a rotary electric machine.

2. Description of the Related Art

As a control apparatus of this type, for example, as shown in JP-A-2008-11683, a control apparatus is proposed in which all switching elements configuring an inverter connected to a three-phase electric motor are turned OFF when excessive current flows through the switching elements of the inverter as a result of a short-circuit abnormality occurring in a switching element. In this control apparatus, the switching element in which the short-circuit abnormality has occurred is identified based on an amount of deviation from a zero point of the current flowing through each phase of the three-phase electric motor when all switching elements are turned OFF.

The phases of the three-phase electric motor are interconnected. Therefore, the current flowing through one phase of the three-phase electric motor can be detected from the currents flowing through the other two phases through use of Kirchhoff's law. Therefore, as a means for detecting phase currents of the three-phase electric motor, a configuration is proposed that includes only a current sensor that detects the respective currents of two phases.

On the other hand, when all switching elements are turned OFF as a result of the short-circuit abnormality, as described above, the amplitude of the current flowing through the three-phase electric motor increases as the rotating speed of the three-phase electric motor increases. Therefore, the inventors of the present invention have found that, in a high rotating speed range, the current flowing through the three-phase electric motor exceeds a detectable range of the current sensor.

When the current flowing through the three-phase electric motor is at an upper limit or a lower limit as described above, identification of the switching element in which the short-circuit abnormality has occurred through use of detection values of the current sensor that has detected the respective currents flowing through the two phases is extremely difficult. A reason for this is that, when the short-circuit abnormality occurs in an upper arm of one phase, the current of this phase deviates upwards from the zero point, and the current of the remaining two phases deviate downwards from the zero point. However, when the current sensor detects the current on the lower limit side and the current on the upper limit side, the current of the one remaining phase is calculated as zero.

SUMMARY

Hence, it is desired to provide a novel device that favorably identifies a short-circuit abnormality in a switching element in a DC-AC converting circuit that includes a serially connected circuit composed of a switching element on a high-potential side and a switching element on a low-potential side that selectively connect a terminal of a rotary electric machine to each of a positive terminal and a negative terminal of a direct-current power source.

An exemplary embodiment provides a control apparatus for a rotary electric machine with terminals receiving power from a DC power supply with positive and negative terminals. The control apparatus includes a DC-AC converting circuit provided with serially connected circuits each having a high-potential-side switching element and a low-potential-side switching element, the high-potential-side and low-potential-side switching elements selectively connecting the terminals of the rotary electric machine to the positive and negative output terminals of the power supply for controlling a controlled variable of the rotary electric machine; a connecting/disconnecting circuit arranged to be electrically opened and closed between the DC-AC converting circuit and the power supply to electrically connect and disconnect an electric path connecting both the DC-AC converting circuit and the power supply; current detecting means that detects a current passing in the rotary electric machine; determining means that determines whether or not the high-potential-side and low-potential-side switching elements have a malfunction which is a short-circuit; and failsafe performing means that turns OFF all the switching elements in the DC-AC converting circuit when the determining means determines that the high-potential-side and low-potential-side switching elements have the malfunction; open/close control means that makes the connecting/disconnecting circuit open when the determining means determines that the high-potential-side and low-potential-side switching elements have the malfunction; turning-on means that turns ON a switching element belonging to part of the high-potential-side and low-potential-side switching elements while avoiding a state where potential at all the terminals of the rotary electric machine become the same potential, when the determining means determines that the high-potential-side and low-potential-side switching elements have the malfunction; and identifying means that identifies a location at which the short-circuit occurs, based on changes in the current detected by the current detecting means in response to turning ON the switching element by the turning-on means, the changes in the current being at least one of a reduction change in deviation of the current from a zero point and a reduction in an absolute value of the current.

When the short-circuit (abnormality) occurs, when all switching elements configuring the DC-AC converting circuit are turned OFF, the current flowing through each terminal of the rotary electric machine deviates from the zero point. The current flowing through each terminal tends to be asymmetrical. Conversely, when a connection state in which the electric potentials of all terminals of the rotary electric machine are the same is actualized, the current flowing through each terminal of the rotary electric machine tends to be symmetrical in relation to the zero point, and the absolute value of the current tends to decrease.

In light of the foregoing, in the invention described above, an ON operation is performed such that the electric potentials of all terminals do not become the same potential by the ON operations performed through electronic control of the switching elements. When the electric potentials of all terminals become the same potential regardless of the ON operation, the short-circuit is identified as occurring in the switching element that has not been turned ON by the identifying means despite the switching element being required to be turned ON to make the electric potentials of all terminals the same potential.

Other advantageous effects of the present disclosure will be cleared in the following descriptions accompanied by the following drawings.

BRIEF DESCRIPTION OF THE DRAWINGS

In the accompanying drawings:

FIG. 2 is a diagram of an overall configuration of a control system of a motor generator according to the first embodiment;

FIG. 5 is a flowchart of procedures in an abnormality diagnosis process according to the first embodiment;

FIG. 11 is a diagram for explaining a method of performing abnormality diagnosis in a variation example according to the fourth embodiment.

DETAILED DESCRIPTION OF THE PREFERRED EMBODIMENTS

Referring to the accompanying drawings, various embodiments for the present invention will now be described.

First Embodiment

A first embodiment of the present invention in which a control apparatus of a rotary electric machine is applied to a parallel hybrid vehicle will hereinafter be described with reference to FIGS. 1-5.

Figure 1:
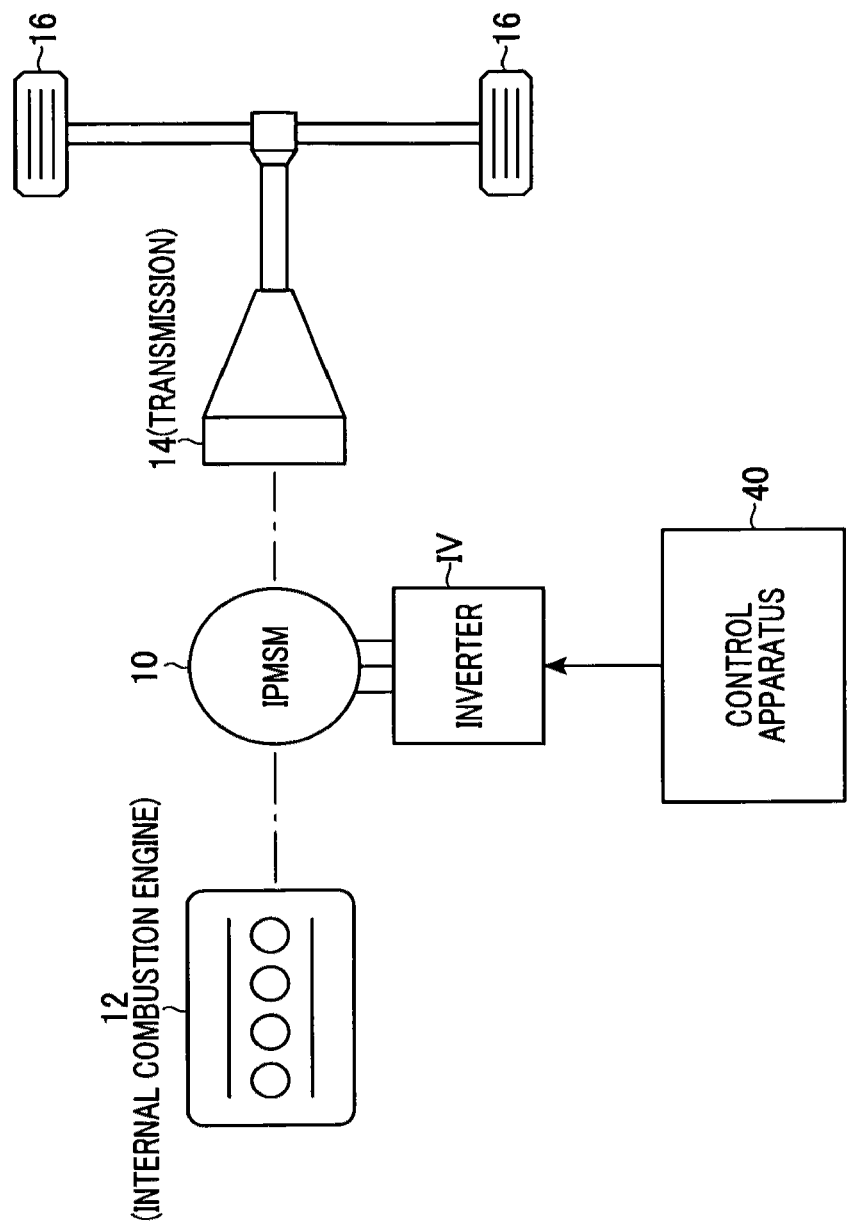
FIG. 1 is a diagram of a system configuration according to a first embodiment.

FIG. 1 is a diagram showing the overall configuration of a control system for a motor generator 10 in the first embodiment. The motor generator 10 serves as a rotary electric machine according to the present invention. As shown in FIG. 1, a motor generator 10 is a three-phase permanent-magnet synchronous rotary electric machine. The motor generator 10 is also a rotating machine having saliency (salient-pole machine). Specifically, the motor generator 10 is an interior permanent-magnet synchronous motor (IPMSM). An output shaft of the motor generator 10 is directly connected coaxially to an output shaft (crank shaft) of an internal combustion engine 12. Therefore, the output shaft of the motor generator 10 and the crank shaft of the internal combustion engine 12 rotate integrally in a coaxial manner, without relatively rotating with each other. The output shaft of the motor generator 10 is also coupled with driving wheels 16 of a transmission 14.

The motor generator 10 is connected to a DC-AC converting circuit (inverter IV).

On the other hand, a control apparatus 40 controls the motor generator 10 and operates the inverter IV. The control apparatus 40 receives, for example, output from a sensor (not shown) that detects various state quantities of the motor generator 10, and operates the inverter IV based on the received output. As a result, the control apparatus 40 controls a controlled variable of the motor generator 10.

FIG. 2 shows details of electronic components provided between the inverter IV and the control apparatus 40.

The inverter IV is connected to a high-voltage battery 20 with a parallel connected circuit therebetween. The parallel connected circuit is composed of a serially connected circuit including a resistor 21 and a relay surface mount resistor (SMR) 2, and a relay SMR 1. The inverter IV is configured by three serially-connected bodies that are connected in parallel. Each serially connected circuit is composed of a high-potential side switching element Swp and a low-potential side switching element Swn serving as power elements. Each contact between the high-potential side switching element Swp and the low-potential side switching element Swn is connected to a phase of the motor generator 10.

A cathode and an anode of a freewheeling diode FDp on the high-potential side are connected between an input terminal and an output terminal (between a collector and an emitter) of the switching element Swp on the high-potential side. A cathode and an anode of a freewheeling diode FDn on the low-potential side are connected between an input terminal and an output terminal (between a collector and an emitter) of the switching element Swn on the low-potential side. Each switching element Swp and Swn is configured by an insulated gate bipolar transistor (IGBT). Each switching element Swp and Swn includes a sense terminal St that outputs a minute current correlated with the current flowing between the input terminal and the output terminal of the switching element Swp and Swn.

The minute current outputted from the sense terminal St flows through a shunt resistor 43. The resulting amount of voltage drop is loaded into a drive unit DU for driving the switching element Sw# (#=p or n). The drive unit DU provides a function for forcibly turning OFF the switching element Sw# when the current flowing between the input terminal and the output terminal of the switching element Sw# is judged to be an excessive current judgment threshold value or more, based on the amount of voltage drop in the shunt resistor 43. The drive unit DU outputs a fail signal FL when the switching element Sw# is forcibly turned OFF.

On the other hand, the control apparatus 40 receives detection values from a voltage sensor 24, current sensors 26 and 28, a rotation angle sensor 30, and the like. The voltage sensor 24 detects a voltage at the input terminal of the inverter IV (voltage of a capacitor 22). The current sensors 26 and 26 respectively detect the currents of the V-phase and the W-phase of the motor generator 10. The rotation angle sensor 30 detects an electrical angle of the motor generator 10. Based on the detection values from the various sensors, the control apparatus 40 generates operation signals gup, gyp, and gwp for operating the switching element Swp and operation signals gun, gvn, and gwn for operating the switching element Swn, for each phase, the U-phase, the V-phase, and the W-phase, of the inverter IV. As a result, the switching elements Swp and Swn are operated by the control apparatus 40 via the drive unit DU connected to a conduction control terminal (gate) of each switching element Swp and Swn.

The control apparatus 40 uses a low-voltage battery 42 as a power source. The low-voltage battery 42 has a lower voltage than the terminal voltage (such as 100V or more) of the high-voltage battery 20.

A low-voltage system including the control apparatus 40 uses the vehicle body as a ground potential and is insulated from the high-voltage system having a different ground potential. A high-voltage system includes the inverter IV and has a ground potential differing from that of the low-voltage system. The low-voltage system and the high-voltage system are insulated by an interface 32 including an insulating means, such as a photocoupler (not shown). The operation signal g*# (*=u, v, or w; #=p or n) is outputted to the high-voltage system via the interface 32.

The interface 32 basically insulates the low-voltage system from the high-voltage system. On a primary side of the interface 32, a failsafe processor 32a is further included that shuts down the inverter IV when the fail signal FL is outputted from the drive unit DU. Here, the failsafe processor 32a may be configured by that described in JP-A-2009-60358 or the like. Here, a situation in which the current flowing through the switching element Sw# exceeds the excessive current judgment threshold value mainly occurs when a short-circuit abnormality occurs in the switching element Sw#. When the short-circuit abnormality occurs, the switching element Sw# is constantly kept in a conductive state regardless of electrical operation. A reason for this is that, as a result of the switching element in which the short-circuit abnormality has occurred and the switching element serially connected thereto being turned ON, a current flows that passes through the pair of switching elements Swp and Swn.

Identification of a short-circuit abnormality location performed when the short-circuit abnormality occurs will hereinafter be described.

Figure 3A:
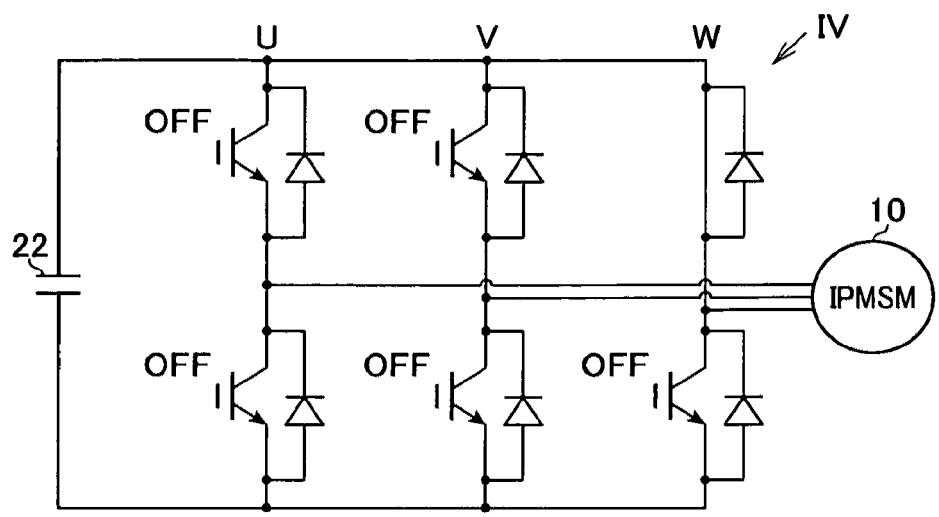
FIG. 3A and FIG. 3B are diagrams of problems arising during short-circuit abnormality.
Figure 3B:
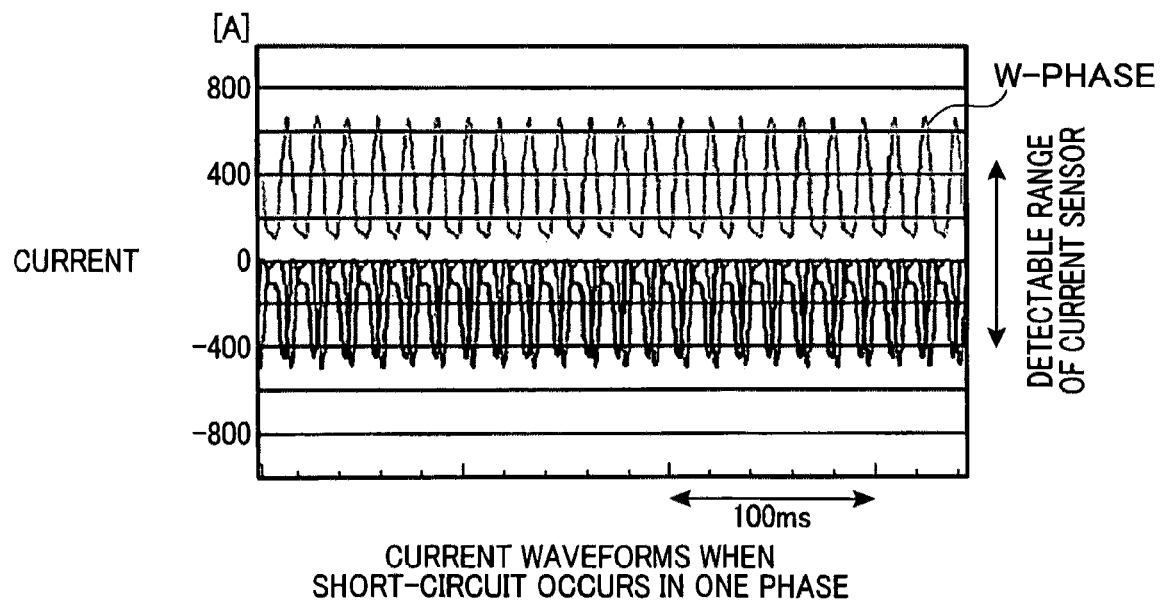

FIG. 3A is a diagram of an equivalent circuit in an instance in which, as a result of the short-circuit abnormality occurring in the switching element Swp in an upper arm of the W-phase, all other switching elements Swp and Swn are turned OFF. FIG. 3B is a diagram showing the behavior of the currents of the three phases. As shown in FIG. 3B, in this instance, a phenomenon occurs in which the amplitude center of the current of each of the three phases deviates from zero, and the maximum value of the absolute value of the current increases. In particular, at this time, the amplitude center of the current of the W-phase deviates upwards from zero, and the amplitude centers of the currents of the U-phase and the V-phase deviate downwards from zero. When the short-circuit abnormality occurs in a lower arm of the W-phase, the amplitude center of the current of the W-phase deviates downwards from zero, and the amplitude centers of the currents of the U-phase and the V-phase deviate upwards from zero. In either instance, a relationship $|iw|=|iu|+|iv|$ is established between the current iu of the U-phase, the current iv of the V-phase, and the current iw of the W-phase. Therefore, as a result of a filtering process or the like being performed on the detection values of the current sensors 26 and 28, thereby calculating the average values of the detection values, the phase and the arm in which the abnormality is occurring can be identified.

The absolute value of the current tends to increase as the rotating speed of the motor generator 10 increases. As a result, a situation may occur in which the average values of the currents exceed the detectable range of the current sensors 26 and 28. In this instance, a problem particularly occurs when the short-circuit abnormality occurs in the V-phase or the W-phase that is subjected to current detection by the current sensors 26 and 28. In other words, in this instance, the sign of the average value of the current of the V-phase and the sign of the average value of the current of the W-phase, calculated by a filtering process being performed on the outputs from the current sensors 26 and 28, may be inverted, and the absolute values may be the same. A reason for this is that the detection value that exceeds the detectable range of the current sensors 26 and 28 becomes the upper limit value or the lower limit value of the detectable range. In this instance, because the average value of the current of the U-phase calculated using Kirchhoff's law becomes zero, the above-described relationship $|iw|=|iu|+|iv|$ is not satisfied, and the short-circuit abnormality location cannot be identified.

Figure 4A:
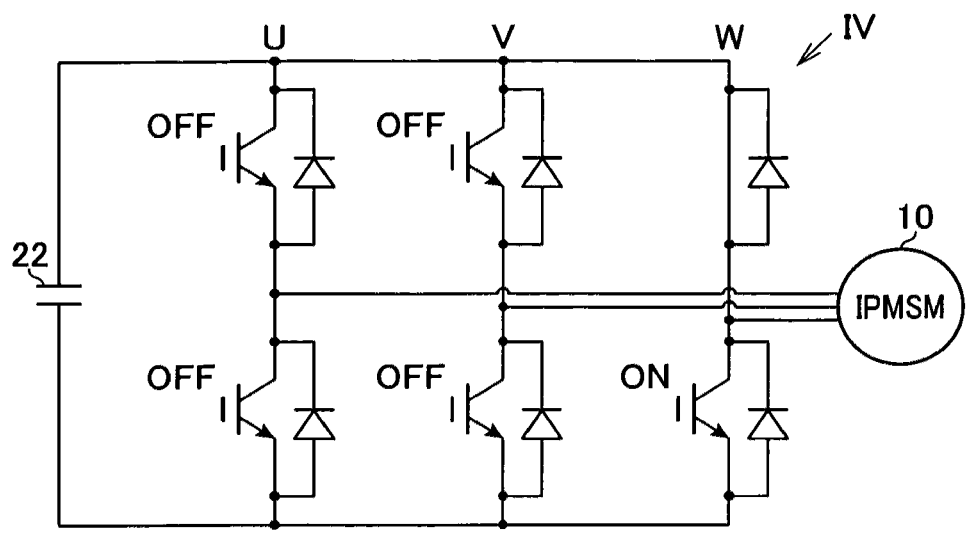
FIG. 4A and FIG. 4B are diagrams for explaining the principle of abnormality diagnosis according to the first embodiment.
Figure 4B:
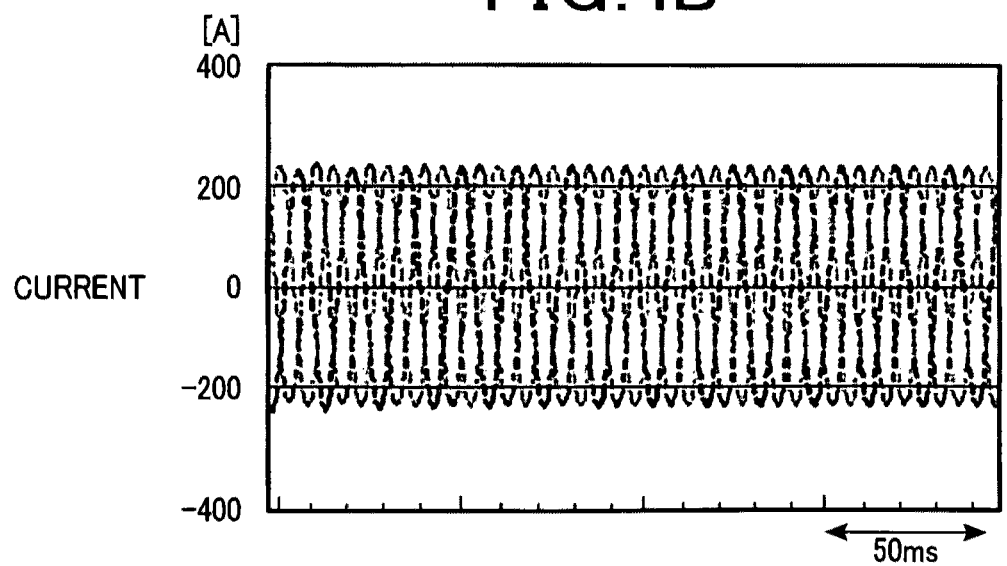

Therefore, according to the first embodiment, as shown in FIG. 4A and FIG. 4B, the short-circuit abnormality location is identified by focus being placed on the changes in the currents caused by the upper and lower arms being short-circuited. FIG. 4A is a diagram of an instance in which, in the W-phase in which the short-circuit abnormality has occurred, the lower arm that is the arm on the side in which the abnormality has not occurred is turned ON. In this instance, as shown in FIG. 4B, the deviation between the amplitude center of the current of each phase and zero is reduced. Therefore, the switching elements Sw# are turned ON one at a time. When the detection value of the current falls within the detectable range, the short-circuit abnormality is considered to have occurred in the switching element serially connected to the switching element that has been turned ON at this time.

FIG. 5 is a flowchart of procedures in a process for identifying the abnormality location according to the first embodiment. The process is repeatedly performed by the control apparatus 40, for example, at a predetermined interval.

In the series of processes, first, at Step S10, the control apparatus 40 judges whether or not a fail signal FL has been inputted. When judged YES at Step S10, at Step 12, the control apparatus 40 turns OFF the relay SMR1 and SMR2. Ordinarily, the relay SMR1 is turned ON and the relay SMR 2 is turned OFF at all times while the motor generator 10 is running. Therefore, in actuality, only the relay SMR1 is required to be turned OFF. Next, at Step S14, the control apparatus 40 judges whether or not the abnormality has been resolved. The process can be performed, for example, by the judgment being made that the abnormality has been resolved when the amplitude center of the current flowing through the motor generator 10 does not significantly deviate from zero.

When judged NO at Step S14, the short-circuit abnormality is considered to be occurring. Therefore, at Step S16, the control apparatus 40 judges whether or not the absolute values of the average values (the values after the filtering process) of the detection values iv and iw of the currents from the current sensors 26 and 28 are a threshold current Ith or more. Here, the threshold current Ith is set depending on the upper limit and the lower limit of the detectable range of current by the current sensors 26 and 28. The process is performed to evaluate the reliability of the average values of the detection values iv and iw. In other words, when the detection values iv and iw are out of the detectable range, the average values of the detection values iv and iw become closer to the upper limit or the lower limit of the detectable range. In this instance, the average values deviate from the actual average values.

When judged NO at Step S16, at Step S18, the control apparatus 40 identifies the abnormality location based on the average values of the detection values iv and iw, and performs a failsafe process based on the identified abnormality location. Here, the failsafe process may be a process for turning ON the switching element serially connected to the switching element Sw# in which the short-circuit abnormality has occurred, and turning OFF the other switching elements.

On the other hand, when judged YES at Step S16, at Step S20, the control apparatus 40 sets a variable i indicating the switching element to be turned ON to "1". At subsequent Step S22, the control apparatus 40 turns ON the switching element indicated by the variable i. In other words, when the variable i is set to "1", the operation signal gup serves as an ON command. When the variable i is set to "2", the operation signal gun serves as the ON command. When the variable i is set to "3", the operation signal gyp serves as the ON command. When the variable i is set to "4", the operation signal gvn serves as the ON command. When the variable i is set to "5", the operation signal gwp serves as the ON command. When the variable i is set to "6", the operation signal gwn serves as the ON command.

At subsequent Step S24, the control apparatus 40 judges whether or not the absolute values of the average values of the detection values iv and iw are smaller than the threshold current Ith. The process is performed to judge whether or not the short-circuit abnormality has occurred in the switching element serially connected to the switching element that is currently turned ON. When judged NO at Step S24, the control apparatus 40 increments the variable i at Step S26 and returns to Step S22. On the other hand, when judged YES at Step S24, the control apparatus 40 fixes the current switching state to perform the failsafe process at Step S28. As a result, only the switching element serially connected to the switching element in which the short-circuit abnormality has occurred is turned ON.

When the process at Step S18 or Step S28 is completed, when judged NO at Step S10, or when judged YES at Step S14, the series of processes is completed for the time being.

The following effects can be achieved according to the first embodiment, described in detail above.

(1) When judged that the short-circuit abnormality has occurred, and the absolute values of the average values of the detection values iv and iw are large, the switching elements Sw# of the inverter IV are successively switched ON, one at a time. The short-circuit abnormality location is identified by the absolute values becoming small. As a result, the short-circuit abnormality location can be identified.

(2) When the short-circuit abnormality location is identified, the switching element that is turned ON at this time is fixed to the ON state. As a result, the failsafe process can be promptly performed to prevent the absolute values of the currents from increasing.

(3) When the absolute values of the detection values iv and iw when the short-circuit abnormality occurs is small, the short-circuit abnormality location is identified based on the relationship among the values of phase currents. As a result, even under a circumstance in which changes in current due to switching become small, the short-circuit abnormality can be identified with high accuracy.

(4) Calculation is performed based on the detection values from the current sensor 26 that detects the current of the V-phase and the current sensor 28 that detects the current of the W-phase, without a means for directly detecting the current of the U-phase of the motor generator 10 being included. In this instance, because identification of the short-circuit abnormality location based on the deviation from the zero point of the current becomes particularly difficult, the advantages of using the changes in current accompanying the switching element being turned ON are particularly significant.

Second Embodiment

A second embodiment will hereinafter be described with reference to FIGS. 6A, 6B, and 7, with focus being placed on the differences with the above-described first embodiment. In the present embodiment and subsequent embodiments, components which are similar or equivalent in there functions to those described already in the first embodiment will be given the same reference numbers for the sake of simplifying the descriptions.

Figure 6A:
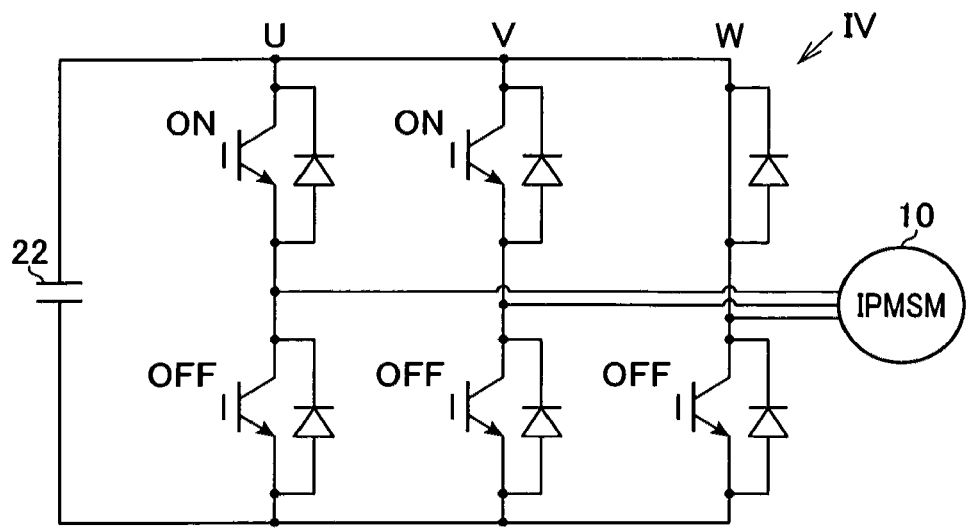
FIG. 6A and FIG. 6B are diagrams for explaining the principle of abnormality diagnosis according to a second embodiment.
Figure 6B:
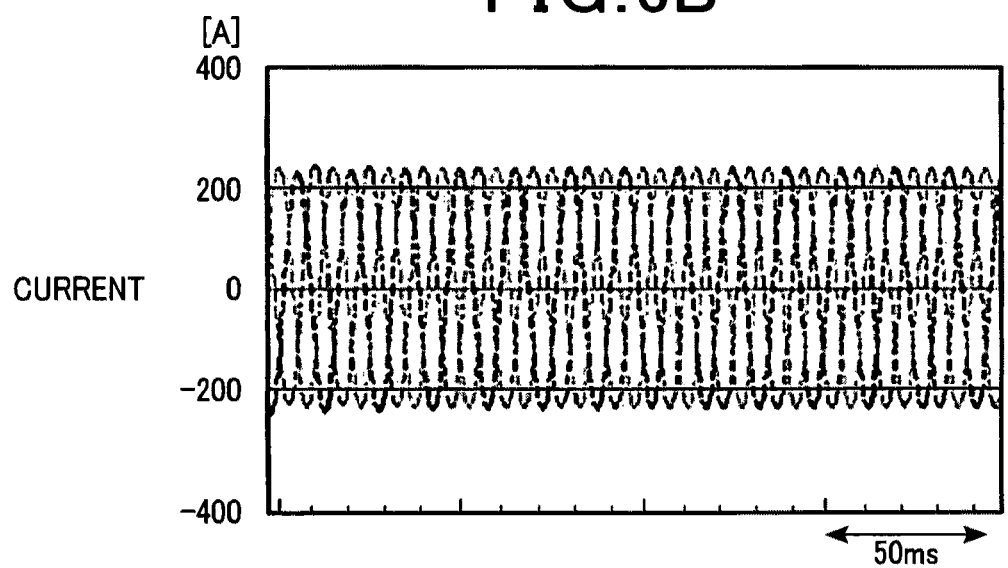

FIG. 6A and FIG. 6B are diagrams of the principle of identification of the short-circuit abnormality location according to the second embodiment. FIG. 6A shows an example of an instance in which, when the short-circuit abnormality is occurring in the switching element Swp of the upper arm of the W-phase, the switching elements Swp of the upper arm of the other two phases in the upper arm are turned ON. FIG. 6B shows the current flowing through the motor generator 10 at this time.

Figure 7:
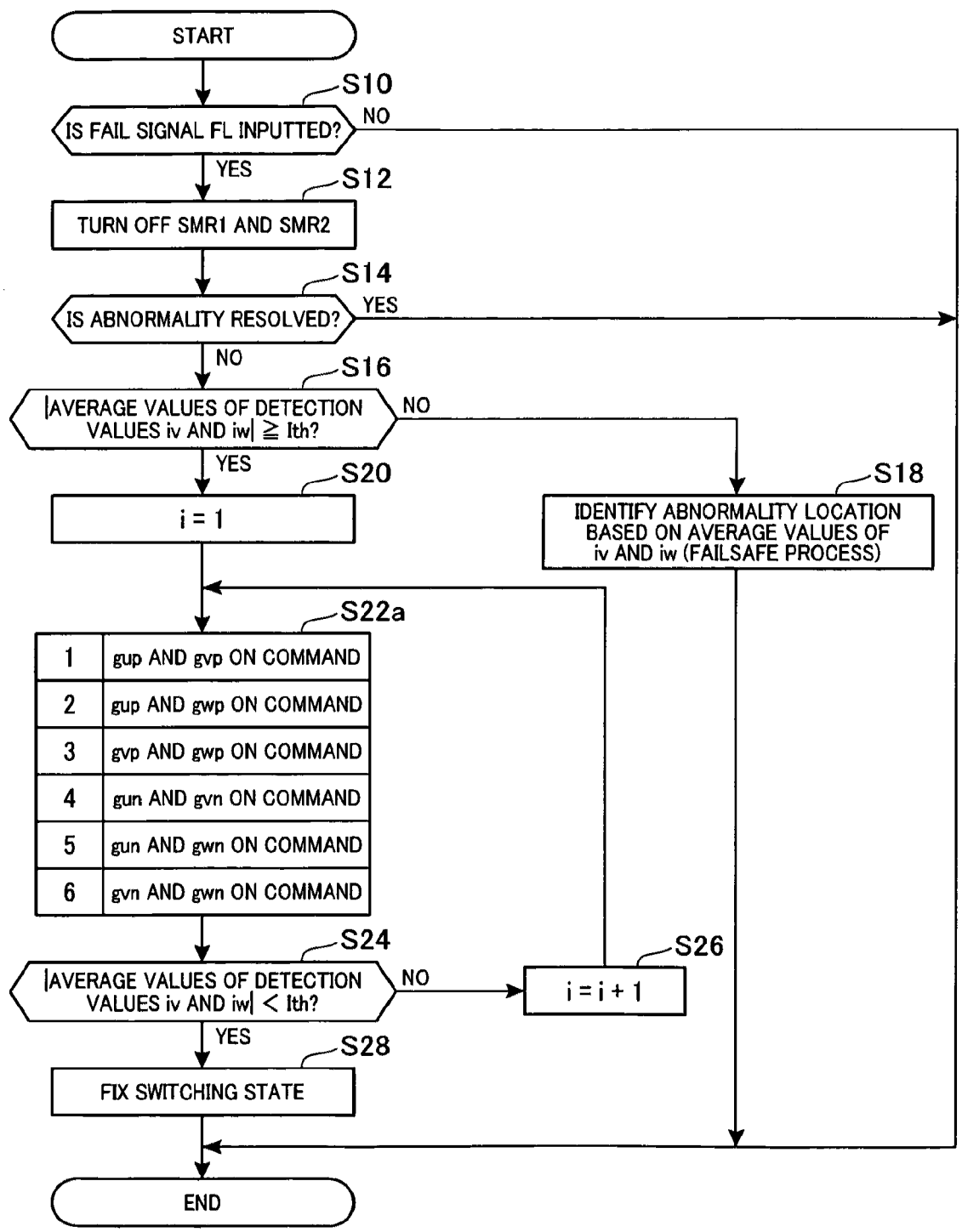
FIG. 7 is a flowchart of procedures in an abnormality diagnosis process according to the second embodiment.

FIG. 7 is a flowchart of the procedures in the process for identifying the abnormality location according to the second embodiment. The process is repeatedly performed by the control apparatus 40, for example, at a predetermined interval. In FIG. 7, the processes corresponding to the processes shown in FIG. 5, described above, are given the same step numbers for convenience.

In the series of processes, in place of the above-described process at Step S22, as a process at Step S22a, the control apparatus 40 successively turns ON the switching elements Sw# of the two phases in the same arm. Specifically, when the variable i is "1", the operation signals gup and gyp serve the ON commands. When the variable i is "2", the operation signals gup and gwp serve as the ON commands. When the variable i is "3", the operation signals gyp and gwp serve as the ON commands. When the variable i is "4", the operation signals gun and gvn serve as the ON commands. When the variable i is "5", the operation signals gun and gwn serve as the ON commands. When the variable i is "6", the operation signals gvn and gwn serve as the ON commands.

Then, when judged YES at Step S24, at Step S28, the control apparatus 40 fixes the current switching state.

In the above-described identification process, in actuality, although the short-circuit abnormality location is narrowed down, an unambiguous identification is not made. In other words, when judged YES at Step 24 when the variable i is "1", for example, an identification is merely made that the short-circuit abnormality has occurred in any of the switching element Swp of the upper arm of the W-phase, the switching element Swn of the lower arm of the U-phase, and the switching element Swn of the lower arm of the V-phase.

Third Embodiment

A third embodiment will hereinafter be described with reference to FIG. 8, with focus being placed on the differences with the above-described first embodiment.

According to the third embodiment, the short-circuit abnormality location is identified with fewer processes than that according to the first embodiment.

Figure 8:
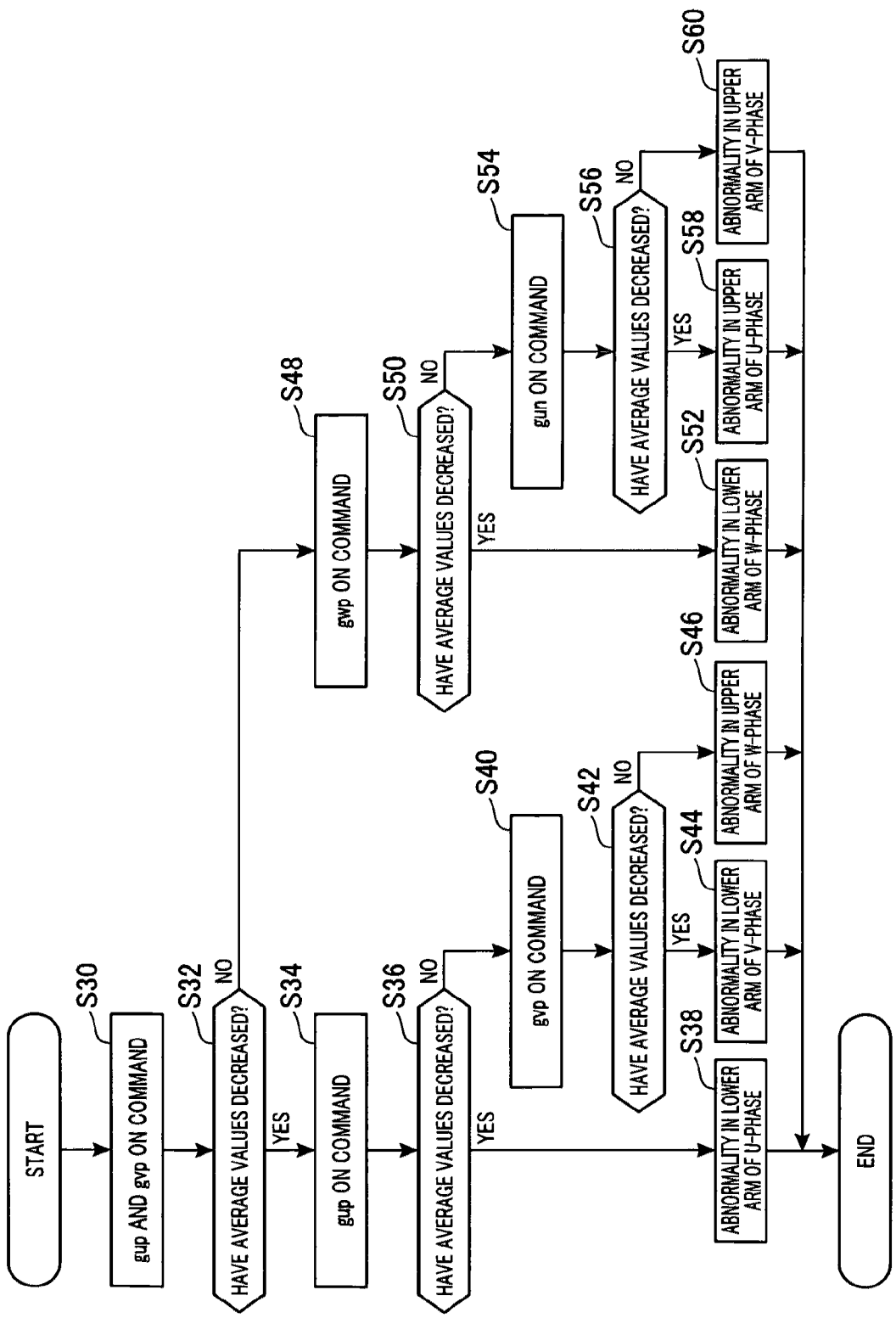
FIG. 8 is a flowchart of procedures in an abnormality diagnosis process according to a third embodiment.

FIG. 8 is a flowchart of the procedures in the identification process according to the third embodiment. The process replaces the processes at Step S20 to Step S22 in FIG. 5, described above. The process is performed by being triggered by the judgment that a short-circuit abnormality has occurred.

In this series of processes, first, at Step S30, the control apparatus 40 uses the operation signals gup and gyp as the ON commands. The process is performed to identify whether the short-circuit abnormality location is the switching element Swn in the lower arm of the U-phase or the V-phase, or the switching element Swp in the upper arm of the W-phase, or elsewhere. At subsequent Step S32, the control apparatus 40 judges whether or not the absolute values of the average values of the detection values iv and iw of the current have decreased to less than the threshold current Ith. When judged YES at Step S32, at Step S34, the control apparatus 40 uses the operation signal gup as the ON command. Here, when judged YES at Step S32, the short-circuit abnormality location can be identified as being either the switching element Swn in the lower arm of the U-phase or the V-phase, or the switching element Swp in the upper arm of the W-phase. Therefore, at Step S34, the control apparatus 40 uses the operation signal gup as the ON command to judge whether or not the short-circuit abnormality is occurring in the switching element Swn in the lower arm of the U-phase, which is one of the possibilities.

Then, when judged at Step S36 that the absolute values of the average values of the detection values iv and iw of the currents have decreased to less than the threshold current Ith, at Step S38, the control apparatus 40 judges that the short-circuit abnormality has occurred in the lower arm of the U-phase. On the other hand, when judged NO at Step S36, the control apparatus 40 uses the operation signal gyp as the ON command to identify either the switching element Swn in the lower arm of the V-phase or the switching element Swp in the upper arm of the W-phase as the short-circuit abnormality location. Then, when judged at Step S42 that the absolute values of the average values of the detection values iv and iw of the currents have decreased to less than the threshold current Ith, at Step S44, the control apparatus 40 judges that the short-circuit abnormality has occurred in the lower arm of the V-phase. On the other hand, when judged No at Step S42, the control apparatus 40 judges that the short-circuit abnormality has occurred in the upper arm of the W-phase.

On the other hand, when judged NO at Step S32, at Step S48, the control apparatus 40 uses the operation signal gwp as the ON command. Then, when judged at Step S50 that the absolute values of the average values of the detection values iv and iw of the currents have decreased to less than the threshold current Ith, at Step S52, the control apparatus 40 judges that the short-circuit abnormality has occurred in the lower arm of the W-phase. On the other hand, when judged NO at Step S50, at Step S54, the control apparatus 40 uses the operation signal gun as the ON command. Then, when judged at Step S56 that the absolute values of the average values of the detection values iv and iw of the currents have decreased to less than the threshold current Ith, at Step S58, the control apparatus 40 judges that the short-circuit abnormality has occurred in the upper arm of the U-phase. On the other hand, when judged NO at Step S56, at Step S60, the control apparatus 40 judges that the short-circuit abnormality has occurred in the upper arm of the V-phase.

Fourth Embodiment

A fourth embodiment will hereinafter be described with reference to FIG. 9, with focus being placed on the differences with the above-described first embodiment.

Figure 9:
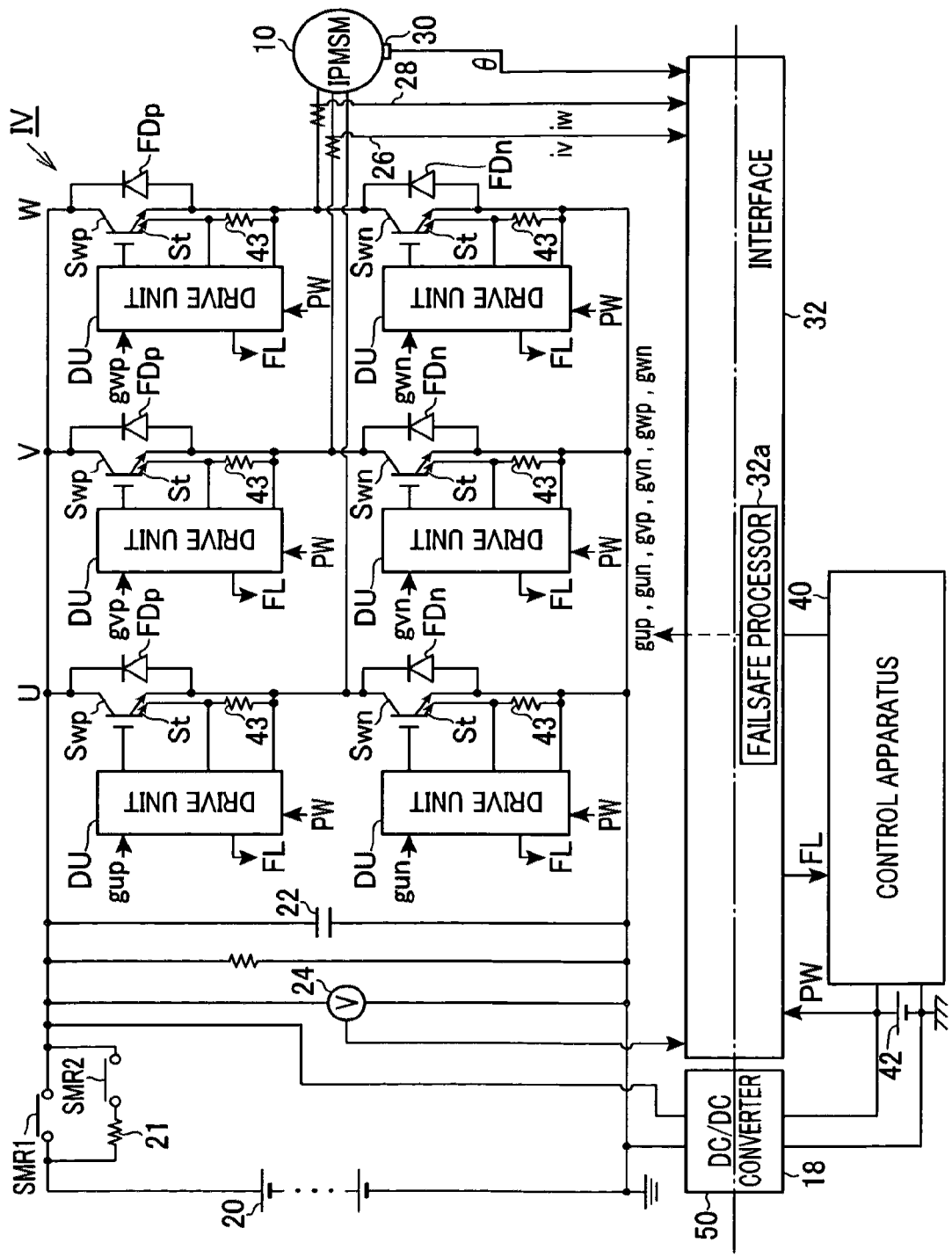
FIG. 9 is a diagram of a system configuration according to a fourth embodiment.

FIG. 9 is a diagram of a system configuration according to the fourth embodiment. In FIG. 9, components corresponding to those in FIG. 1 are given the same reference numbers for convenience.

As shown in FIG. 9, an input terminal of a DC/DC converter 50 is connected between the relay SMR1 and SMR2, and the inverter IV. The DC/DC converter 50 is a step-down converter that steps down the input voltage and outputs the stepped-down voltage. The output voltage of the DC/DC converter 50 is applied to the low-voltage battery 42. As a result, the power from the high-voltage battery 20 can be supplied to the low-voltage battery 24 and devices within the low-voltage system via the DC/DC converter 50.

When the system is configured as described above, the DC/DC converter 50 is the only charging means of the low-voltage battery 42. Therefore, when the relay SMR1 and SMR2 are opened as the failsafe process as according to the first embodiment, travelable distance may be restricted by a charge amount of the low-voltage battery 42 by a limp-home process. Therefore, according to the fourth embodiment, the failsafe process is modified from that according to the first embodiment.

Figure 10:
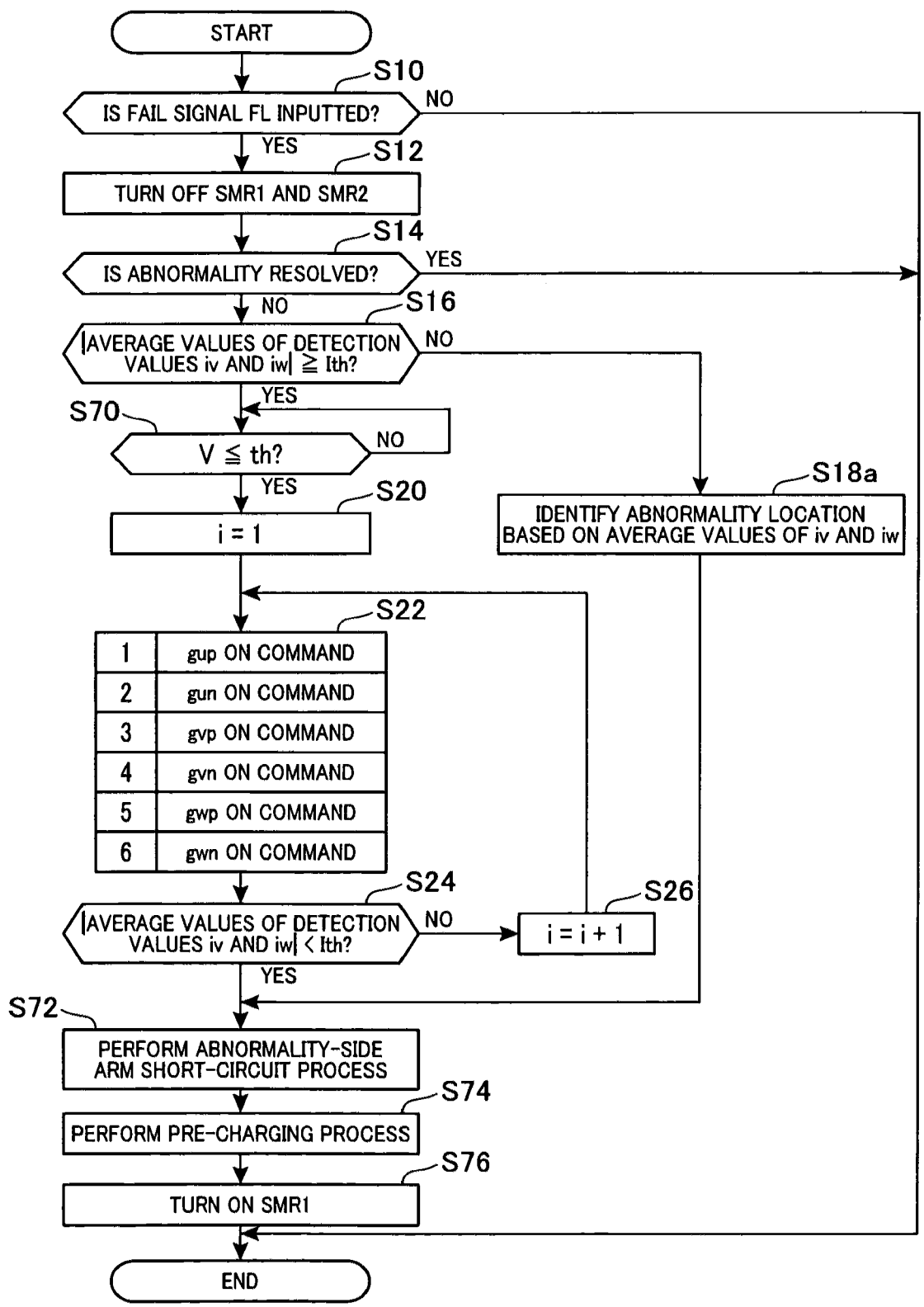
FIG. 10 is a flowchart of procedures in an abnormality diagnosis process according to the fourth embodiment.

FIG. 10 is a flowchart of the procedures in the process for identifying the abnormality location according to the fourth embodiment. The process is repeatedly performed by the control apparatus 40, for example, at a predetermined interval.

In the series of processes, when judged YES at Step S16, the control apparatus 40 waits until the voltage V of the capacitor 22 detected by the voltage sensor 24 becomes a threshold voltage Vth or less (Step S70). When the switching elements S*# are successively turned ON by the process at Step S22 and the switching element serially connected to the switching element in which the short-circuit abnormality has occurred is turned ON, thereby causing a through-current to flow though the switching elements, this process is performed to prevent the amount of through-current from becoming excessively large. The threshold voltage Vth is set to be an upper limit value or less, the upper limit value being that at which the amount of through-current is not expected to become excessively large.

When the process at Step S24 is completed, or when the process for identifying the abnormality location based on the average values of the detection values iv and iw at Step S18a is completed, at Step 972, the control apparatus 40 turns ON all switching elements in the arm belonging to the switching element in which the short-circuit abnormality has occurred. This process is performed to prevent the absolute value of the current flowing through the motor generator 10 from becoming excessively large. At subsequent Step S74, the control apparatus 40 performs a pre-charging process of the capacitor 22. In other words, the control apparatus 40 turns ON the SMR2 while the SMR1 is turned OFF. The capacitor 22 is charged by the power from the high-voltage battery 20 while the resistor 21 restricts the charge current. Then, when the pre-charging process is completed, at Step S76, the control apparatus 40 turns ON the relay SMR1. As a result, during the failsafe process performed to prevent the absolute value of the current from becoming large, the low-voltage battery 42 can be changed by the power from the high-voltage battery 20 by the DC/DC converter 50. As a result, a situation in which the low-voltage battery 42 runs out of power and traveling becomes impossible, despite the high voltage battery 20 having usable power, can be favorably so prevented.

Through the second to fourth embodiments described above, the operations and advantages which are identical or similar those provided in the first embodiment can be provided in addition to the advantages inherent to the second to fourth embodiments.

<Modifications>

The above-described embodiments may be modified as described below.

According to the first embodiment, in a manner similar to that according to the second embodiment, the short-circuit abnormality location can be identified by a method in which the switching elements of two phases in the same arm are turned ON. In this instance, the method according to the second embodiment may also be used as the failsafe process after identification of the short-circuit abnormality location. In terms of reducing energy consumption, the method according to the first embodiment is preferably used as the failsafe process.

The identifying means is not limited to that in which all switching patterns in which the electric potentials of all terminals of the motor generator do not become the same are attempted. For example, one of the six patterns according to the first embodiment may be eliminated. In other words, in this instance, when the detection values iv and iw do not fall within the detectable range in the five attempted patterns, an identification can be made that the short-circuit abnormality has occurred in the switching element corresponding to the pattern that has not been attempted.

The identifying means is not limited to that based on whether or not the detection values iv and iw fall within the detectable range. For example, the identifying means may be based on whether or not the difference between the average values of the detection values iv and iw and the zero point changes to a prescribed value or less.

Instead of the waiting means (that is, delay means) being included, an identification can be made that the short-circuit abnormality has occurred in the switching element serially connected to the switching element S*# when a current passing through the switching element S*# and the switching element serially connected thereto flows as a result of the switching element S*# being turned ON. When the charge voltage of the capacitor 22 is high, the through-current is considered to flow through the switching element S*# and the switching element serially connected thereto as a result of the switching element S*# being turned O. The through-current is thought to exceed the excessive current judgment threshold. Therefore, a judgment can be made that the through-current is flowing as a result of the fail signal FL being outputted again.

The failsafe performing means according to the first embodiment and the second embodiment is not limited to that in which the current switching state is maintained when the inverter IV is shut down when the excessive current is detected and the short-circuit abnormality location is identified. For example, according to the first embodiment, all switching operations (1) to (6) may be attempted regardless of whether or not the short-circuit abnormality location is identified. In this instance, a switching state in which the detection values iv and iw fall within the detectable range may occur more than once. This occurs when, as shown in the example in FIG. 11, the short-circuit abnormality has occurred in two locations. In this example, the short-circuit abnormality has occurred in the upper arm of the V-phase and the lower arm of the W-phase. In this instance, a phenomenon is considered to occur in which the detection values iv and iw fall within the detectable range when an ON operation is performed in the lower arm of the V-phase and when an ON operation is performed in the upper arm of the W-phase.

According to the fourth embodiment, as a rule, only when the process according to the first embodiment is performed and the power of the low-voltage battery 42 becomes insufficient, the process can be switched to the processes at Step S72 to Step S76. When the short-circuit abnormality occurs in both upper and lower arms as shown in FIG. 11, the processes at Step S72 to Step S76 are preferably not performed.

The determining means is not limited to that actualized by an excessive current protection function mounted in the drive unit DU. For example, the determining means may be configured by the control apparatus 40 that receives the output signals from the current sensors 26 and 28.

The means for detecting current is not limited to that including the means for detecting the current of each remaining terminal excluding the one terminal of the multi-phase rotary electric machine. For example, the means for detecting current may include a means for detecting the current flowing through each of the terminals of the multi-phase rotary electric machine. In this instance as well, identification of the short-circuit abnormality location based on a current outside of the detectable range falling within the detectable range as a result of a certain switching element being turned ON or the deviation of the average value of the terminal current from the zero point being reduced is effective.

The rotary electric machine is not limited to the IPMSM. A principle of resolving the abnormality similar to that in the subject application is considered applicable for any machine that includes at least a permanent magnet, such as a surface permanent magnet synchronous machine (SPM).

The configuration is not limited to that in which the high-voltage system and the low-voltage system are insulated (the ground potential differs).

The hybrid vehicle is not limited to the parallel hybrid vehicle. For example, the hybrid vehicle may be a series hybrid vehicle. Furthermore, the hybrid vehicle may be a series-parallel hybrid vehicle. However, when the upper arms of a plurality of inverters are interconnected and the lower arms of the inverters are interconnected, the process performed by the identifying means is preferably performed after the means for performing switching between the inverters and the direct current power source is in an open state. Furthermore, the vehicle may be an electric vehicle of which energy mode is only electrical energy (including that which generates electrical energy, such as a fuel cell) stored for an in-vehicle drive source.

The vehicle may include a switch between the inverter IV and the motor generator 10. In this instance as well, including the identifying means is effective in terms of identifying the short-circuit abnormality location. The switch is in a closed state while the identifying means is turning ON the switching elements.

What is claimed is:

1. A control apparatus for a rotary electric machine with terminals receiving power from a DC power supply with positive and negative terminals, comprising:
    a DC-AC converting circuit provided with serially connected circuits each having a high-potential-side switching element and a low-potential-side switching element, the high-potential-side and low-potential-side switching elements selectively connecting the terminals of the rotary electric machine to the positive and negative output terminals of the power supply for controlling a controlled variable of the rotary electric machine;
    a connecting/disconnecting circuit arranged between the DC-AC converting circuit and the power supply so as to selectively and electrically connect or disconnect an electric path connecting both the DC-AC converting circuit and the power supply;
    current detecting means that detects a current passing in the rotary electric machine;
    determining means that determines whether or not the high-potential-side and low-potential-side switching elements have an abnormality; and
    first failsafe performing means that turns OFF all the switching elements in the DC-AC converting circuit when the determining means determines that the high-potential-side and low-potential-side switching elements have the abnormality;

open/close control means that makes the connecting/disconnecting circuit open when the determining means determines that the high-potential-side and low-potential-side switching elements have the abnormality;

second determining means that determines whether or not the abnormality has been resolved depending on the current detected by the current detecting means after the first failsafe performing means has turned OFF all the switching elements;

current determining means that determines whether or not the current detected by the current detecting means is outside a current detectable range previously given to the current detecting means;

turning-on means that turns ON a switching element alternately designated among the high-potential-side and low-potential-side switching elements while avoiding a state where potential at all the terminals of the rotary electric machine become the same potential, when the second determining means determines that the abnormality has not been resolved yet and the current determining means determines that the detected current is outside the current detectable range; and identifying means that identifies a location at which the abnormality occurs as a short circuit, based on changes in the current detected by the current detecting means in response to alternately turning ON the switching element by the turning-on means.

2. The control apparatus of claim 1, wherein the identifying means is configured to identify the location based on information showing that the current detected in response to alternately turning ON the switching element remains within the current detectable range.

3. The control apparatus of claim 2, wherein the changes in the current correspond to a state where whether or not deviation of an amplitude center of the detected current from a current zero point reduces, and
the identifying means includes means for determining whether or not a deviation of an amplitude center of the detected current from a current zero point reduces.

4. The control means of claim 3, wherein
the turning-on means is configured to turn ON alternately the switching elements which is assumed to be electrically connected between the one of the terminals of the rotary electric machine and one of the terminals of the DC power supply.

5. The control apparatus of claim 4, wherein the identifying means is configured to identify, as the location at which the short-circuit occurs, a switching element serially connected to the turned-on switching element in response to a predetermined change in the current by turning ON the switching element,
the control apparatus comprises
second failsafe performing means is configured to fix the turned-on switching element at a turned-on state thereof when the identifying means identifies the location at which the short-circuit has occurred.

6. The control apparatus of claim 3, wherein
the switching element belonging to the high-potential-side and low-potential-side switching elements are composed of a plurality of switching elements which are electrically connected to one of the terminals of the rotary electric machine and other terminals of the DC power supply which are other than one of the terminals thereof corresponding to the one terminal of the rotary electric machine, and
the turning-on means is configured to turn ON alternately the switching element which is electrically connected between to one of the terminals of the rotary electric machine and other terminals of the DC power supply which are other than one of the terminals thereof corresponding to the one terminal of the rotary electric machine.

7. The control apparatus of claim 3, wherein
the switching element alternately designated among the high-potential-side and low-potential-side switching elements is composed of a combination of i) one or more first switching elements among a plurality of switching elements which are electrically connected to one of the terminals of the rotary electric machine and other terminals of the DC power supply which are other than one of the terminals thereof corresponding to the one terminal of the rotary electric machine, and ii) one or more second switching elements which are electrically connected between one of the terminals of the rotary electric machine and the one of the terminals of the DC power supply; and
the turning-on means is configured to turn ON alternately the first and second switching elements.

8. The control apparatus of claim 3, wherein
the DC power supply is a high-voltage power supply outputting a first voltage,
a step-down converter that steps down the first voltage from the high-voltage power supply to a second voltage useable in the control apparatus, and
the step-down converter is electrically connected to the high high-voltage power supply via the connecting/disconnecting circuit,
the control apparatus comprises
second failsafe performing means is configured to turn ON all of the switching elements connected in an arm at which the short-circuit occurs and make the open/close control means to close the connecting/disconnecting circuit, when the identifying means identifies the location at which the short-circuit has occurred.

9. The control apparatus of claim 3, comprising a capacitor electrically connected parallel to the DC power supply via the connecting/disconnecting circuit,
wherein the turning-on means includes delay means for delaying turning ON the switching element until a time at which voltage of the capacitor decrease to a predetermined value.

10. The control apparatus of claim 3, wherein the identifying means identifies the location at which the short-circuit occurs, based on relative amplitudes of averages of the currents respectively passing the terminals of the rotary electric machine, when the current determining means determines that the detected current is within the current detectable range.

11. The control apparatus of claim 3, wherein the current detecting means is configured to detect the current at each of terminals, among the terminals of the rotary electric machine, which are other than one specified terminal, and
the current detecting means includes means for calculating the current passing the specified one terminal, based on currents passing all the other terminals respectively.

12. The control apparatus of claim 3, wherein
the switching element belonging to the high-potential-side and low-potential-side switching elements are composed of a plurality of switching elements which are electrically connected to one of the terminals of the rotary electric machine and other terminals of the DC power supply which are other than one of the terminals thereof corresponding to the one terminal of the rotary electric machine, and the turning-on means is configured to turn ON alternately the switching element which is electrically connected between to one of the terminals of the rotary electric machine and other terminals of the DC power supply which are other than one of the terminals thereof corresponding to the one terminal of the rotary electric machine.

13. The control apparatus of claim 3, wherein
the switching element alternately designated among the high-potential-side and low-potential-side switching elements is composed of a combination of i) one or more first switching elements among a plurality of switching elements which are electrically connected to one of the terminals of the rotary electric machine and other terminals of the DC power supply which are other than one of the terminals thereof corresponding to the one terminal of the rotary electric machine, and ii) one or more second switching elements which are electrically connected between one of the terminals of the rotary electric machine and the one of the terminals of the DC power supply; and
the turning-on means is configured to turn ON alternately the first and second switching elements.

14. The control apparatus of claim 3, wherein
the DC power supply is a high-voltage power supply outputting a first voltage,
a step-down converter that steps down the first voltage from the high-voltage power supply to a second voltage useable in the control apparatus, and
the step-down converter is electrically connected to the high high-voltage power supply via the connecting/disconnecting circuit,
the control apparatus comprises
second failsafe performing means configured to turn ON all of the switching elements connected in an arm at which the short-circuit occurs and make the open/close control means to close the connecting/disconnecting circuit, when the identifying means identifies the location at which the short-circuit has occurred.

15. The control apparatus of claim 3, comprising a capacitor electrically connected parallel to the DC power supply via the connecting/disconnecting circuit,
wherein the turning-on means includes delay means for delaying turning ON the switching element until a time at which voltage of the capacitor decrease to a predetermined value.

16. The control apparatus of claim 3, wherein the identifying means identifies the location at which the short-circuit occurs, based on relative amplitudes of averages of the currents respectively passing the terminals of the rotary electric machine, when the current determining means determines that the detected current is within the current detectable range.

17. The control apparatus of claim 3, wherein the current detecting means is configured to detect the current at each of terminals, among the terminals of the rotary electric machine, which are other than one specified terminal, and
the current detecting means includes means for calculating the current passing the specified one terminal, based on currents passing all the other terminals respectively.

18. The control apparatus of claim 1, wherein the changes in the current correspond to a state where whether or not deviation of an amplitude center of the detected current from a current zero point reduces, and
the identifying means includes means for determining whether or not a deviation of an amplitude center of the detected current from a current zero point reduces.

19. The control means of claim 18, wherein
the turning-on means is configured to turn ON alternately the switching elements which is assumed to be electrically connected between one of the terminals of the rotary electric machine and one of the terminals of the DC power supply.

20. A control apparatus for a rotary electric machine with terminals receiving power from a DC power supply with positive and negative terminals, comprising:
a DC-AC converting circuit provided with serially connected circuits each having a high-potential-side switching element and a low-potential-side switching element, the high-potential-side and low-potential-side switching elements selectively connecting the terminals of the rotary electric machine to the positive and negative output terminals of the power supply for controlling a controlled variable of the rotary electric machine;
a connecting/disconnecting circuit arranged to be electrically opened and closed between the DC-AC converting circuit and the power supply to electrically connect and disconnect an electric path connecting both the DC-AC converting circuit and the power supply;
current detecting means that detects a current passing in the rotary electric machine;
determining means that determines whether or not the high-potential-side and low-potential-side switching elements have a malfunction which is a short-circuit; and
failsafe performing means that turns OFF all the switching elements in the DC-AC converting circuit when the determining means determines that the high-potential-side and low-potential-side switching elements have the malfunction;
open/close control means that makes the connecting/disconnecting circuit open when the determining means determines that the high-potential-side and low-potential-side switching elements have the malfunction;
turning-on means that turns ON a switching element belonging to part of the high-potential-side and low-potential-side switching elements while avoiding a state where potential at all the terminals of the rotary electric machine become the same potential, when the determining means determines that the high-potential-side and low-potential-side switching elements have the malfunction; and
identifying means that identifies a location at which the short-circuit occurs, based on changes in the current detected by the current detecting means in response to turning ON the switching element by the turning-on means, the changes in the current being at least one of a reduction in deviation of the current from a zero point and a reduction change in an absolute value of the current;
wherein the turning-on means is configured to turn ON the switching element when the detected current is outside a current detectable range given to the current detecting means, and
the identifying means is configured to identify the location based on information showing that the current detected in response to turning ON the switching element remains within the current detectable range.

21. A control apparatus for a rotary electric machine with terminals receiving power from a DC power supply with positive and negative terminals, comprising:
a DC-AC converting circuit provided with serially connected circuits each having a high-potential-side switching element and a low-potential-side switching element, the high-potential-side and low-potential-side switching elements selectively connecting the terminals of the rotary electric machine to the positive and negative output terminals of the power supply for controlling a controlled variable of the rotary electric machine;

a connecting/disconnecting circuit arranged to be electrically opened and closed between the DC-AC converting circuit and the power supply to electrically connect and disconnect an electric path connecting both the DC-AC converting circuit and the power supply;

current detecting means that detects a current passing in the rotary electric machine;

determining means that determines whether or not the high-potential-side and low potential-side switching elements have a malfunction which is a short-circuit; and failsafe performing means that turns OFF all the switching elements in the DC-AC converting circuit when the determining means determines that the high-potential-side and low-potential-side switching elements have the malfunction;

open/close control means that makes the connecting/disconnecting circuit open when the determining means determines that the high-potential-side and low-potential-side switching elements have the malfunction;

turning-on means that turns ON a switching element belonging to part of the high-potential-side and low-potential-side switching elements while avoiding a state where potential at all the terminals of the rotary electric machine become the same potential, when the determining means determines that the high-potential-side and low-potential-side switching elements have the malfunction; and identifying means that identifies a location at which the short-circuit occurs, based on changes in the current detected by the current detecting means in response to turning ON the switching element by the turning-on means, the changes in the current being at least one of a reduction in deviation of the current from a zero point and a reduction change in an absolute value of the current;

wherein the switching element belonging to the part of the high-potential-side and low-potential-side switching elements are composed of a plurality of switching elements which are electrically connected between one of the terminals of the rotary electric machine and one of the terminals of the DC power supply, and the turning-on means is configured to turn ON sequentially the switching elements which are electrically connected between the one of the terminals of the rotary electric machine and the one of the terminals of the DC power supply.

* * * * *